(12) United States Patent
Wang et al.

(10) Patent No.: US 7,745,840 B2
(45) Date of Patent: Jun. 29, 2010

(54) SOLIDE-STATE LIGHT SOURCE

(75) Inventors: Chun-Wei Wang, Miao-Li Hsien (TW); Hung-Kuang Hsu, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 105 days.

(21) Appl. No.: 12/192,336

(22) Filed: Aug. 15, 2008

(65) Prior Publication Data

US 2009/0140277 A1 Jun. 4, 2009

(30) Foreign Application Priority Data

Nov. 29, 2007 (CN) .................. 2007 10 202776

(51) Int. Cl.
*H01L 21/02* (2006.01)
(52) U.S. Cl. .............. 257/95; 257/99; 257/100; 257/13; 257/25; 257/E33.055; 257/E33.057; 257/E33.059
(58) Field of Classification Search ............. 257/13–25, 257/88–100, E33.055–59
See application file for complete search history.

(56) References Cited

U.S. PATENT DOCUMENTS

| 4,018,692 | A | * | 4/1977 | Akselrad et al. ......... 252/62.57 |
|---|---|---|---|---|
| 5,910,940 | A | * | 6/1999 | Guerra ................... 369/275.1 |
| 6,575,584 | B1 | * | 6/2003 | Habraken ................. 362/609 |
| 6,610,598 | B2 | * | 8/2003 | Chen ...................... 438/666 |
| 6,682,211 | B2 | | 1/2004 | English et al. |
| 6,742,907 | B2 | * | 6/2004 | Funamoto et al. .......... 362/625 |
| 6,784,460 | B2 | * | 8/2004 | Ng et al. .................. 257/95 |
| 7,071,494 | B2 | | 7/2006 | Steigerwald et al. |
| 7,352,011 | B2 | | 4/2008 | Smits et al. |
| 7,525,126 | B2 | * | 4/2009 | Leatherdale et al. ......... 257/98 |
| 7,541,610 | B2 | * | 6/2009 | Haase ...................... 257/13 |
| 2006/0007667 | A1 | * | 1/2006 | Chen et al. .................. 362/97 |
| 2006/0013002 | A1 | | 1/2006 | Coushaine et al. |
| 2007/0290190 | A1 | * | 12/2007 | Haase et al. ................. 257/13 |
| 2009/0008662 | A1 | * | 1/2009 | Ashdown et al. ............ 257/98 |

FOREIGN PATENT DOCUMENTS

| CN | 1381904 A | 11/2002 |
|---|---|---|
| CN | 1716646 A | 1/2006 |

* cited by examiner

*Primary Examiner*—Michael S Lebentritt
(74) *Attorney, Agent, or Firm*—Andrew C. Cheng

(57) ABSTRACT

A solid-state light source includes a substrate, a solid-state light-emitting chip, a plurality of micro-members and a light-permeable encapsulation. The substrate has a substantially flat surface. The solid-state light-emitting chip is arranged on the substantially flat surface of the substrate and electrically connected to the substrate. The micro-members are arranged on the surface of the substrate and parallel with the solid-state light emitting chip. The light-permeable encapsulation is arranged on the surface of the substrate and covers the solid-state light-emitting chip and the micro-members.

17 Claims, 8 Drawing Sheets

SOLIDE-STATE LIGHT SOURCE

BACKGROUND

1. Field of the Invention

The present invention relates to solid-state light sources and, particularly, to a light-emitting diode.

2. Description of Related Art

Light-emitting diodes (LED) as a kind of solid-state light sources, have many advantages, such as low power-consumption, long lifespan, small volume, and high luminance, etc., such that they are widely used in backlight modules of liquid crystal displays, light sources of vehicles, and illumination sources, etc. This is disclosed in IEEE Electronic Components and Technology Conference, entitled "Unique White LED Packaging Systems", which is published in 2003 and incorporated herein by reference.

A typical LED includes a substrate, a LED chip and a resinous encapsulation. The substrate has electrodes arranged thereon, and the LED chip is connected electrically to the electrodes of the substrate. The resinous encapsulation has a light-emitting surface far away from the substrate, and micro-lenses are formed on the light-emitting surface thereof for decreasing the total reflection phenomenon incident on the light-emitting surface and improving the light-emitting ability of the LED.

However, since the micro-lenses are formed on the light-emitting surface of the encapsulation, the size and the distribution of the micro-lenses are difficult to be controlled. Furthermore, the micro-lenses are prone to be destroyed or abraded, such that the light-emitting capability of the LED is still not good.

Therefore, what is needed is providing a solid-state light source, which has an excellent light-emitting ability.

SUMMARY

A solid-state light source includes a substrate, a solid-state light-emitting chip, a plurality of micro-members and a light-permeable encapsulation. The substrate has a substantially flat surface. The solid-state light-emitting chip is arranged on the substantially flat surface of the substrate and electrically connected to the substrate. The micro-members are arranged on the surface of the substrate and parallel with the solid-state light emitting chip. The light-permeable encapsulation is arranged on the surface of the substrate and covers the solid-state light-emitting chip and the micro-members.

Other advantages and novel features of the present invention will become more apparent from the following detailed description of at least one preferred embodiment when taken in conjunction with the accompanying drawings.

BRIEF DESCRIPTION OF THE DRAWINGS

Many aspects of the present solid-state light source can be better understood with reference to the following drawings. The components in the drawings are not necessarily to scale, the emphasis instead being placed upon clearly illustrating the principles of the present touch control display device. Moreover, in the drawings, like reference numerals designate corresponding parts throughout the several views.

DETAILED DESCRIPTION OF EMBODIMENTS

Figure 1:
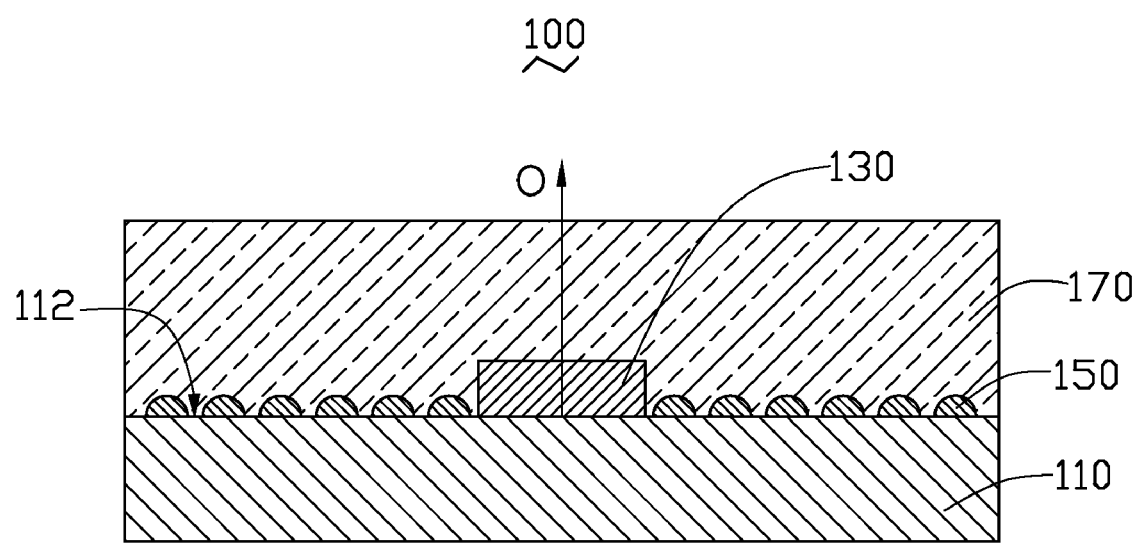
FIG. 1 is a schematic, cross-sectional view of a solid-state light source, according to a first exemplary embodiment of the present invention.

Reference will now be made to the drawings to describe, in detail, at least one preferred embodiment of the present solid-state light source.

Referring to FIGS. 1 to 5, a solid-state light source 100, in accordance with a first exemplary embodiment of the present invention is provided. The solid-state light source 100 includes a substrate 110, a solid-state light-emitting chip 130, a plurality of micro-members 150 and a light-permeable encapsulation 170.

The substrate 110 has a substantially flat surface 112, and a pair of electrodes (not shown) formed on the substantially flat surface 112. The substrate 110 may be manufactured by integrating plastic material with the electrodes. Alternatively, the substrate 110 may be manufactured by forming through holes in a planar board made of silicon or ceramic, etc., and then printing a conducting pattern on a surface of the planar board and filling a conducting material into the through holes.

The solid-state light-emitting chip 130 is arranged on the substantially flat surface 112 of the substrate 110 and electrically connected to the substrate 110. Concretely, the solid-state light-emitting chip 130 is wired with the electrodes of the substrate 110 such that it is electrically connected to the substrate 110. The solid-state light-emitting chip 130 may be an LED chip, such as red, green, blue or ultraviolet (UV) LED chip. Alternatively, the solid-state light source 100 may includes a plurality of solid-state light-emitting chip 130, such as a composition of red, green, blue LED chips. The solid-state light source 100 is an LED.

The plurality of micro-members 150 are arranged on the substantially flat surface 112 of the substrate 110 and parallel with the solid-state light-emitting chip 130. A height of the micro-members 150 along a direction indicated by an arrow O as shown in FIG. 1, is less than that of the solid-state light-emitting chip 130.

Figure 2:
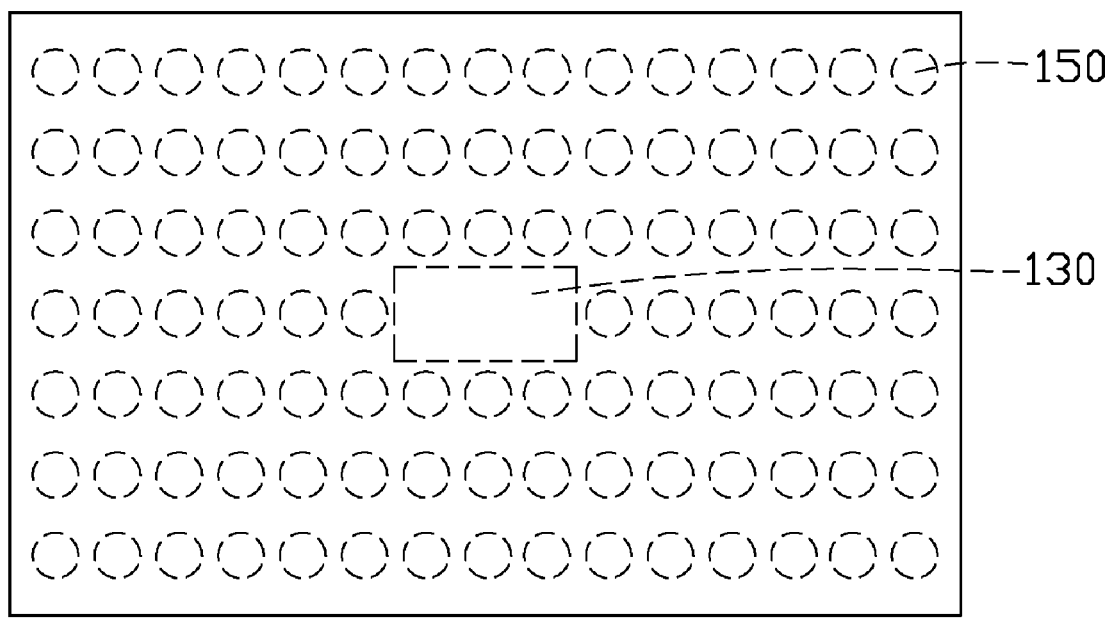
FIG. 2 is a schematic, top view of the solid-state light source in FIG. 1, showing a plurality of micro-members distributed regularly on a substantially flat surface of a substrate.
Figure 3:
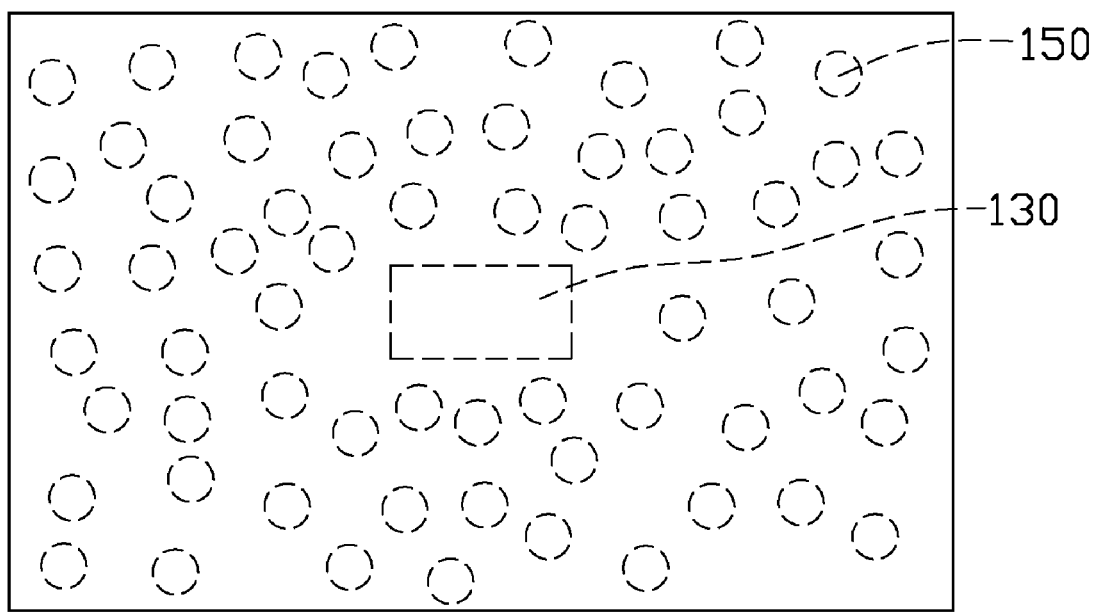
FIG. 3 is a schematic, top view of the solid-state light source in FIG. 1, showing a plurality of micro-members distributed irregularly on a substantially flat surface of a substrate.

Referring to FIG. 2, the micro-members 150 are evenly distributed on the substantially flat surface 112 of the substrate 110 to form an array. Furthermore, the solid-state light-emitting chip 130 is surrounded by the micro-members 150. Alternatively, the micro-members 150 may be unevenly distributed on the substantially flat surface 112 of the substrate 110 as shown in FIG. 3. The micro-members 150 are configured for reducing the total reflection phenomenon incident thereon. The cross section of the micro-members 150 is semicircular as shown in FIG. 1. The cross section of the micro-members 150 may be other shaped, such as semielliptical.

Figure 4:
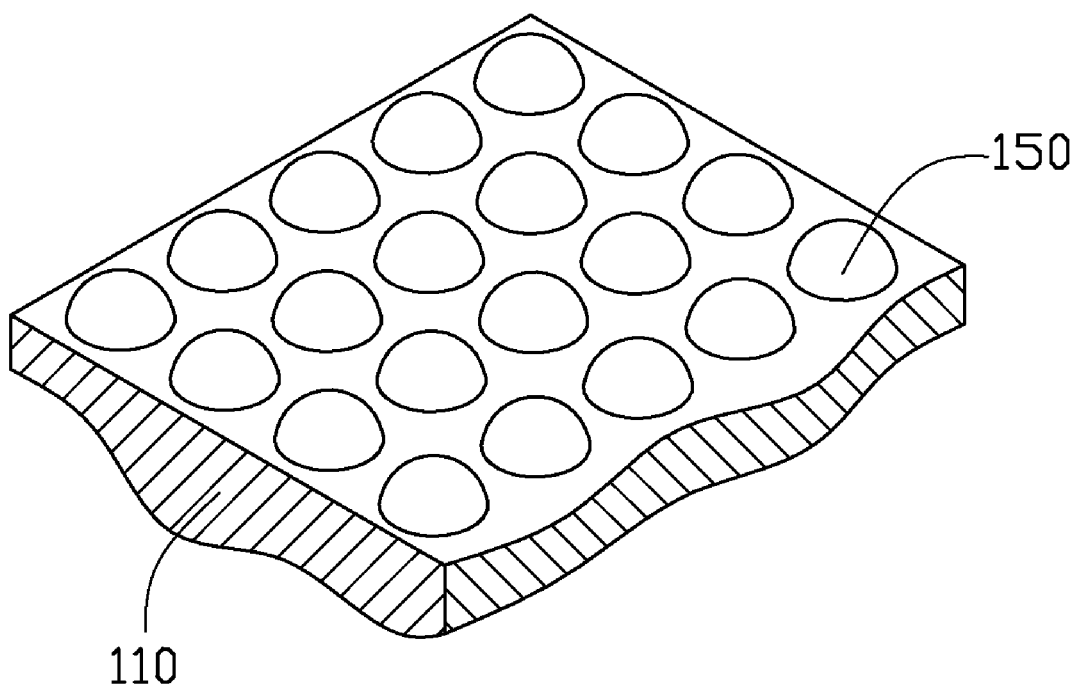
FIG. 4 is a schematic, part-enlarged exploded view of the solid-state light source in FIG. 1, showing a plurality of dot micro-members arranged on the substantially flat surface of the substrate.
Figure 5:
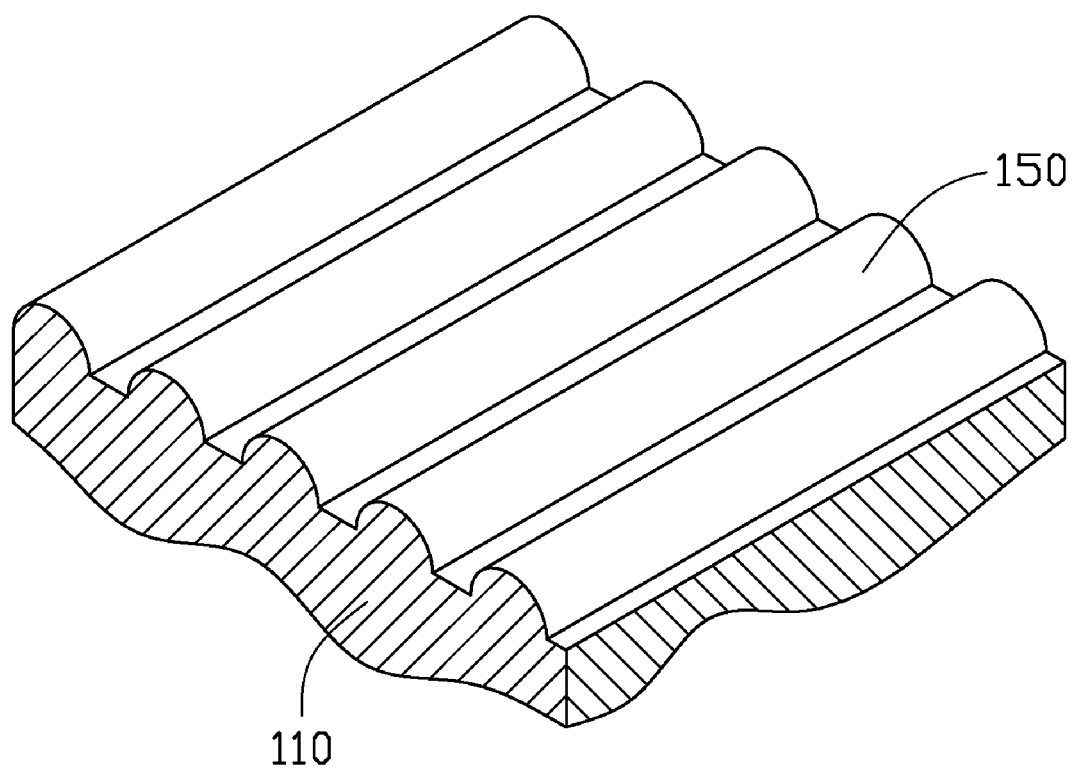
FIG. 5 is a schematic, part-enlarged exploded view of the solid-state light source in FIG. 1, showing a plurality of elongated micro-members arranged on the substantially flat surface of the substrate.

The micro-members 150 may be dot micro-members, such as micro-lenses as shown in FIG. 4. Alternatively, the micro-members 150 also can be elongated micro-members, such as lenticular lenses as shown in FIG. 5. The micro-members 150 may be made of metal or ceramic, and can be formed on the substantially flat surface 112 of the substrate 110 by means of etching. Alternatively, the micro-members 150 may be made of plastic, and can be formed on the substantially flat surface 112 of the substrate 110 by means of injection molding such that the micro-members 150 are integrated with the substrate 110. In addition, the micro-members 150 may be made of white or transparent ink, and can be formed on the substantially flat surface 112 of the substrate 110 by means of screen printing.

The light-permeable encapsulation 170 is arranged on the substantially flat surface 112 of the substrate and covers the solid-state light-emitting chip 130 and the micro-members 150. The light-permeable encapsulation 170 may be transparent and made of a material having a refractive index different from those of the micro-members 150. The refractive index of the encapsulation 170 is more than or equal to 1.4. The encapsulation 170 can be made of silicon or epoxy resin, etc, and formed on the substantially flat surface 112 of the substrate 110 by means of dispensing or molding.

Due to the fact that the present solid-state light source 100 forms the micro-members 150 on the substantially flat surface 112 of the substrate 110 instead of the encapsulation 170, thus the solid-state light source 100 can be easily manufactured. Furthermore, since the micro-members 150 are encapsulated in the encapsulation 170, the encapsulation 170 can prevent the micro-members from being destroyed or abraded, such that the present solid-state light source 100 may achieve a excellent light-emitting ability.

Figure 6:
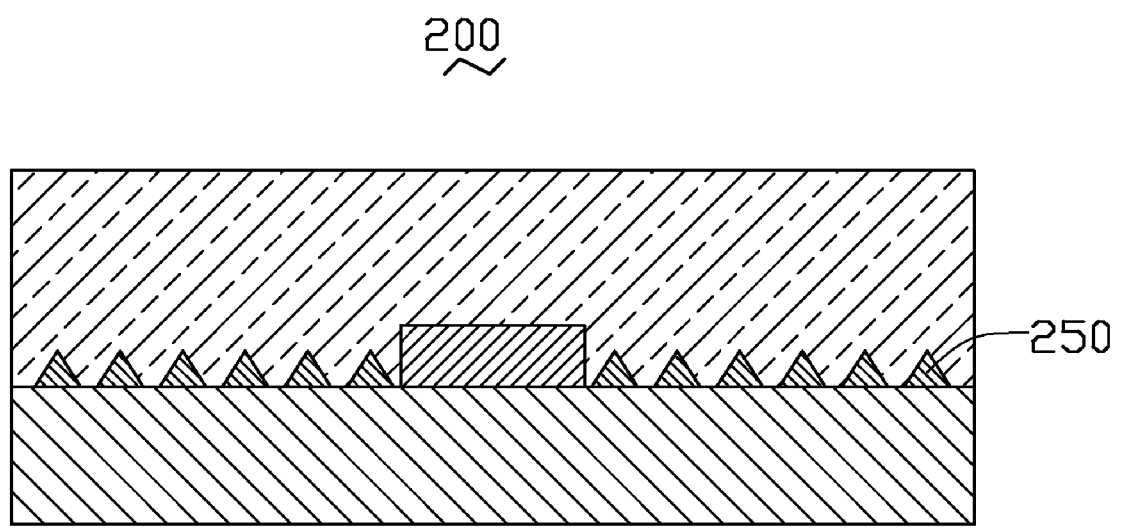
FIG. 6 is a schematic, cross-sectional view of a solid-state light source, according to a second exemplary embodiment of the present invention.
Figure 7:
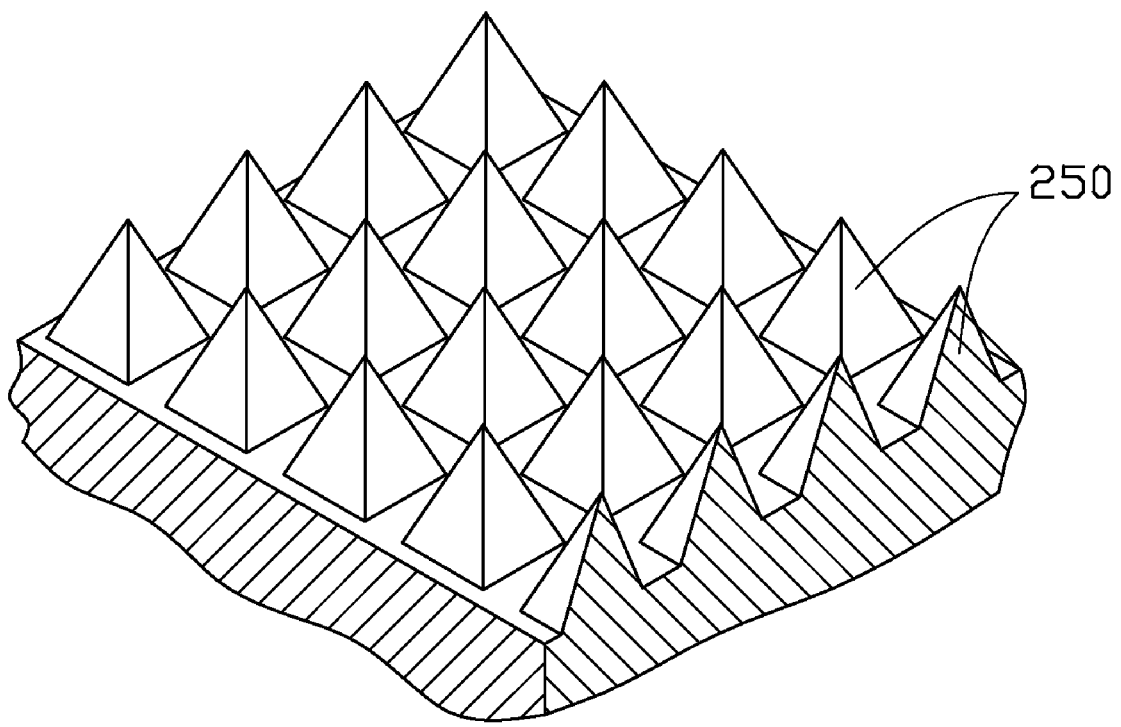
FIG. 7 is a schematic, part-enlarged exploded view of the solid-state light source in FIG. 6, showing a plurality of dot micro-members arranged on a substantially flat surface of a substrate.
Figure 8:
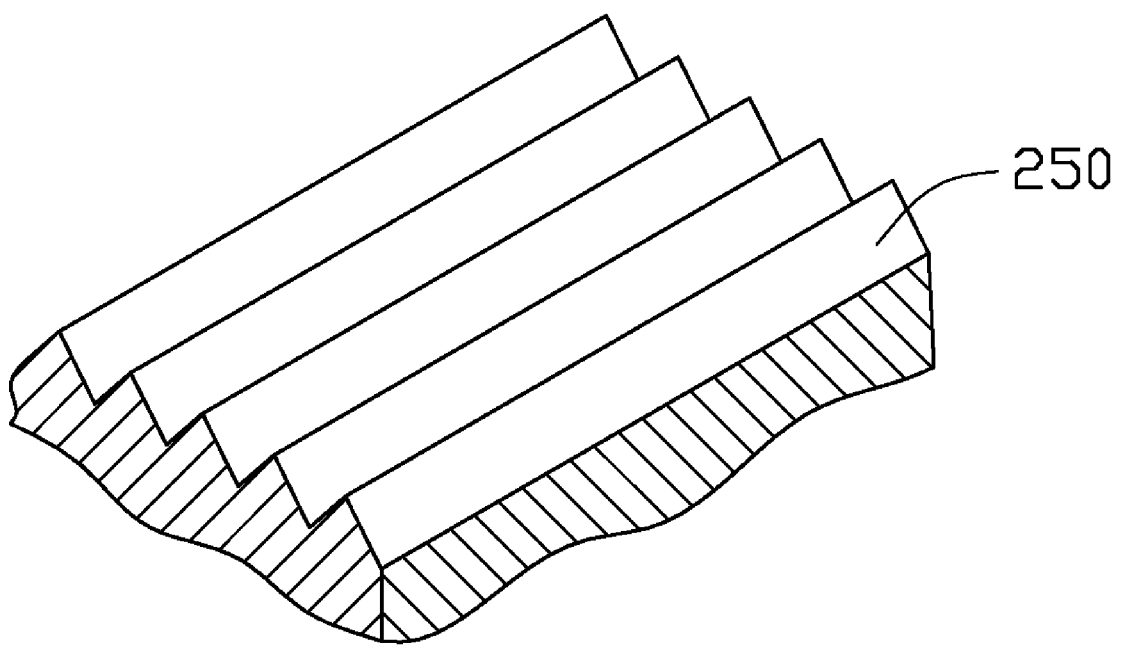
FIG. 8 is a schematic, part-enlarged exploded view of the solid-state light source in FIG. 6, showing a plurality of elongated micro-members arranged on the substantially flat surface of the substrate.

Referring to FIGS. 6-8, a solid-state light source 200, in accordance with a second exemplary embodiment of the present invention, is provided. The solid-state light source 200 is similar that of the first exemplary embodiment, except that the cross sections of the micro-members 250 of the solid-state light source 200 are substantially triangular. The micro-members 250 may be dot micro-members, such as pyramids as shown in FIG. 7. Alternatively, the micro-members 250 may be elongated micro-members, such as micro prisms as shown in FIG. 8.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A solid-state light source, comprising:
   a substrate having a substantially flat surface;
   a solid-state light-emitting chip arranged on the substantially flat surface of the substrate and electrically connected to the substrate;
   a plurality of micro-members arranged on the substantially flat surface of the substrate; and
   a light-permeable encapsulation arranged on the substantially flat surface of the substrate and covering the solid-state light-emitting chip and the micro-members.

2. The solid-state light source as claimed in claim 1, wherein the light-permeable encapsulation has a refractive index different from that of the micro-members.

3. The solid-state light source as claimed in claim 2, wherein the refractive index of the light-permeable encapsulation is more than or equal to 1.4.

4. The solid-state light source as claimed in claim 1, wherein a height of the micro-members relative to the substantially flat surface of the substrate is less than that of the solid-state light-emitting chip relative to the substantially flat surface.

5. The solid-state light source as claimed in claim 1, wherein the solid-state light-emitting chip is surrounded by the micro-members.

6. The solid-state light source as claimed in claim 1, wherein the micro-members are distributed regularly on the substantially flat surface of the substrate to form an array.

7. The solid-state light source as claimed in claim 1, wherein the micro-members are distributed irregularly on the substantially flat surface of the substrate.

8. The solid-state light source as claimed in claim 1, wherein the micro-members are dot micro-members.

9. The solid-state light source as claimed in claim 8, wherein the micro-members are selected from a group consisting of hemispherical, partially hemispherical and pyramidal.

10. The solid-state light source as claimed in claim 1, wherein the micro-members are elongated micro-members.

11. The solid-state light source as claimed in claim 10, wherein the micro-members are selected from a group consisting of lenticular lenses and micro prisms.

12. The solid-state light source as claimed in claim 1, wherein the micro-members are made of plastic.

13. The solid-state light source as claimed in claim 1, wherein the micro-members are made of one of white ink and transparent ink.

14. The solid-state light source as claimed in claim 1, wherein the solid-state light-emitting chip includes an LED chip.

15. A device comprising:
    a circuit board having a circuit board surface;
    a light-emitting chip electrically mounted on the circuit board surface;
    a plurality of reflecting members arranged on the circuit board surface surrounding the light-emitting chip therein; and
    a light-permeable encapsulation arranged on the circuit board surface of the substrate and entirely covering the light-emitting chip and the reflecting members.

16. The device as claimed in claim 15, wherein the reflecting members are protrusions protruding from the circuit board surface.

17. The device as claimed in claim 15, wherein a height of the protrusions relative to the circuit board surface is less than that of the light-emitting chip relative to the circuit board surface.

* * * * *